United States Patent
Huang

(10) Patent No.: US 6,813,205 B2
(45) Date of Patent: Nov. 2, 2004

(54) PRE-CHARGE AND SENSE-OUT CIRCUIT FOR DIFFERENTIAL TYPE ROM

(75) Inventor: Shih-Huang Huang, Hsin-Chu (TW)

(73) Assignee: Mediatek Incorporation, Hsin-Chu Hsien (TW)

(*) Notice: Subject to any disclaimer, the term of this patent is extended or adjusted under 35 U.S.C. 154(b) by 26 days.

(21) Appl. No.: 10/604,508

(22) Filed: Jul. 28, 2003

(65) Prior Publication Data

US 2004/0196715 A1 Oct. 7, 2004

(30) Foreign Application Priority Data

Apr. 7, 2003 (TW) .......................................... 092107926

(51) Int. Cl.[7] ................................................ G11C 7/00
(52) U.S. Cl. ........................ 365/203; 365/205; 365/149
(58) Field of Search ................................ 365/203, 205, 365/208, 149, 189.06, 189.05

(56) References Cited

U.S. PATENT DOCUMENTS 6,141,259 A * 10/2000 Scott et al. ............ 365/189.06

2003/0235101 A1 * 12/2003 Tanaka et al. .............. 365/203
2004/0007719 A1 * 1/2004 Hata .......................... 257/202

* cited by examiner

Primary Examiner—Gene N. Auduong
(74) Attorney, Agent, or Firm—Winston Hsu

(57) ABSTRACT

A pre-charge and sense out circuit for differential type ROM. The ROM is capable of connecting to either a first bit line or a second bit line. The pre-charge and sense out circuit contains a pre-charging module electrically connected to the first and the second bit lines, for pre-charging the first and the second bit lines; a selecting module electrically connected to the first bit line, the second bit line, a first data line, and a second data line, for transmitting data according to a first control signal; a charge sharing module electrically connected to the first and the second data lines, for sharing electrical charges to the first and the second data lines; and a sensing module electrically connected to the first and the second data lines, for sensing signals on the first and the second data lines so as to generate an output signal.

10 Claims, 3 Drawing Sheets

PRE-CHARGE AND SENSE-OUT CIRCUIT FOR DIFFERENTIAL TYPE ROM

BACKGROUND OF INVENTION

1. Field of the Invention

The invention relates to a pre-charge and sense-out circuit, and more particularly, to a pre-charge and sense-out circuit used for a differential type ROM with a charge-sharing module.

2. Description of the Prior Art

Among various applications of electronic products, memory chips are always an important and essential component. According to how data is treated after the removal of power, memory chips used today is divided into two types volatile or non-volatile. Volatile memory is a data storage device that offers the advantage of high-access speed which can be used as a buffer between a high-speed cell processor and other parts of the circuit but at the cost of losing digital data when power is removed. Examples of volatile memory include DRAM and SDRAM. Non-volatile memory is a data storage device that offers the advantage of retaining digital data even when power is removed but at the cost of having an access speed that is slower than that of volatile memory. Examples of non-volatile memory include ROMs and flash memory.

The application field for memory chips is vast. As technology advances, so too does the application field for memory chips. Besides functioning as data storage devices for personal computers, memory chips are also used in a variety of electronic products such as laptop computers, personal digital assistants (PDAs), cell phones, and digital cameras.

Typical memory chips installed in an electronic product have three major modes of operation writing (programming), erasing, and reading. Which mode of operation the memory is in is dependent on the control signal from the electronic product. Memory chips will switch to the writing mode when the electronic product writes digital data into a specific storing address in the memory as indicated by the control signal. Memory chips will switch to the erasing mode when the electronic product erases digital data from a specific storing address in the memory as indicated by the control signal. Finally, memory chips will switch to the reading mode when the electronic product reads digital data from a specific storing address in the memory as indicated by the control signal.

A memory chip is usually comprised of a sense-out circuit (or a sensing amplifier) electrically connected to a memory-cell array used for the storing of digital data or the sending out of stored data from a specific storing address within the memory-cell array as indicated by the control signal. The architecture of a sense-out circuit was published in IEEE International SOI Conference, p.143–144, Oct. 1, 2001. FIG. 1 shows a sense-out circuit of a differential type ROM according to prior art. The differential type ROM is comprised of a sense-out circuit 10 and a memory-cell array 20, wherein the memory-cell array 20 includes a plurality of memory cells 22. The addresses within a memory cell 22 is defined by a plurality of word lines WL1~WLn and a plurality of pairs of bit lines $(BL_{11}, BL_{12})$~$(BL_{m1}, BL_{m2})$. In other words the intersections between each word line and pair of bit lines are electrically connected to a memory cell 22.

FIG. 1 shows a memory-cell array 22 that can be composed of any number of memory cells 22 stacked one on top of another as indicated by the dotted line between the first and last memory cells 22. For simplicity though, the following descriptions will treat the memory cell array 20 as having two memory cells 22. Each memory cell is physically composed of two NMOS transistors. The gate of each transistor within the same memory cell is electrically connected to the same word line; however, the drain of each transistor within the same memory cell is electrically connected to different bit line in a pair of bit lines. For example in FIG. 1, the drains of the left transistors are electrically connected to the left bit line $BL_{11}$, and the drains of the right transistors are electrically connected to the right bit line $BL_{12}$.

Before writing data to a memory cell 22, the sources of both NMOS transistors must be grounded. To write logical data into a memory cell 22, the connection between one of the NMOS transistors and bit lines must be cut by some means such as with a laser. Whatever connection is destroyed gives the memory cell its logical value. Severing the connection between the left transistor and the left bit line assigns a logical value of "1" to the memory cell. Severing the connection between the right transistor and right bit line assigns a logical value of "0" to the memory cell. For example, the top memory cell 22 of FIG. 1 (X represents a severed connection), has a logical value of "1" while the bottom memory cell 22 has a logical value of "0".

The pair of bit lines $BL_{11}$, $BL_{12}$ is electrically connected to a pre-charge module 12 within the sense-out circuit 10. (Remember the pair of bit lines ($BL_{11}$, $BL_{12}$) is only the first pair of a plurality of bit lines ranging from ($BL_{11}$, $BL_{12}$)~($BL_{m1}$, $BL_{m2}$) all of which are connected and function in the same way). The pre-charge module 12 is used to pre-charge the pair of bit lines $BL_{11}$, $BL_{12}$. A pair of data lines, $DL_1$, $DL_2$ is electrically connected to a different pre-charge module 16 within the same sense-out circuit. This second pre-charge module is used to pre-charge the two data lines, $DL_1$, $DL_2$. A selecting module 14 is located between the two pre-charge modules and serves to electrically connect the pair of bit lines to the two data lines i.e. $BL_{11}$ to $DL_1$ and $BL_{12}$ to $DL_2$. The purposes of the selecting module is to transmit signals between the bit lines and the data lines according to the first control signal Y1 and to produce an output signal corresponding to the logical data stored in the memory cell 22 to the two data lines $DL_1$, $DL_2$.

When the memory chip reads the data, only one memory cell is selected at a time. This means that only one pair from the plurality of pairs of bit lines ($BL_{11}$, $BL_{12}$)~($BL_{m1}$, $BL_{m2}$) is selected, and only one word line from the plurality of word lines within the selected pair of bit lines is chosen. For example in FIG. 1, the selection of the pair of the bit lines $BL_{11}$, $BL_{12}$ and the word line $WL_1$ gives the data in the top memory cell 22 to the chip to read. To ensure the data from the top memory cell in FIG. 1 along the pair of bit lines $BL_{11}$, $BL_{12}$ is properly read without error, the selecting module 14 in the prior sense-out circuit 10 uses a high-$V_{TH}$ device to separate the pairs of bit lines and data lines. By doing so, effects of current leakage from memory cells 22 on unselected pairs of bit lines connected to the same sense-out circuit 10 in this case ($BL_{21}$, $BL_{22}$)~($BL_{m1}$, $BL_{m2}$) is prevented.

But there is a disadvantage for using the high-$V_{TH}$ device in the selecting module 14. Generally, the turn-on time of the high-$V_{TH}$ device is longer than the rest of the parts in the memory chip. As a result when the control signal Y1 instructs the memory chip to read data and turn on the high-$V_{TH}$ device, the operational time becomes longer. Thus, the access time of the memory chip will be substantially affected.

SUMMARY OF INVENTION

It is therefore the primary objective of the claimed invention to provide a pre-charge and sense-out circuit, which contains a charge-sharing module, to solve the above-mentioned problem.

According to the claimed invention, a pre-charge and sense-out circuit of a differential type ROM is disclosed for sensing logical data stored in a memory cell of the ROM, the memory cell being capable of connecting and then sending digital signals along either one of a pair of bit lines. The pre-charge and sense-out circuit is comprised of:

1) A pre-charge module electrically connected to a pair of bit lines connected to the memory cell for the purpose of pre-charging the said pair of bit lines 2) A selecting module electrically connected to the above-mentioned pair of bit lines and two data lines where each bit line corresponds to a unique and separate data line. The purpose of the selecting module is to transmit signals as instructed from the first control signal from the bit line to the data line 3) A charge-sharing module electrically connected to the two data lines. The purpose of the charge-sharing module is to pre-charge the two data lines and to also share stored electrical charges within the module with the two data lines as instructed by a second control signal.

4) A sensing module electrically connected to the two data lines for sensing signals from the two data lines to generate an output signal.

The present invention uses a pre-charge module and a charge-sharing module to pre-charge the pair of bit lines and the two data lines to ground potential. Thus data reading from the memory cell on the selected bit line from the pair will not be affected by the current leakage from the unselected bit line from the pair. Also, the charge-sharing module shares stored electrical charges with the two data lines while reading data, so as to speed up the signals on the first and the second data lines into a stable state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
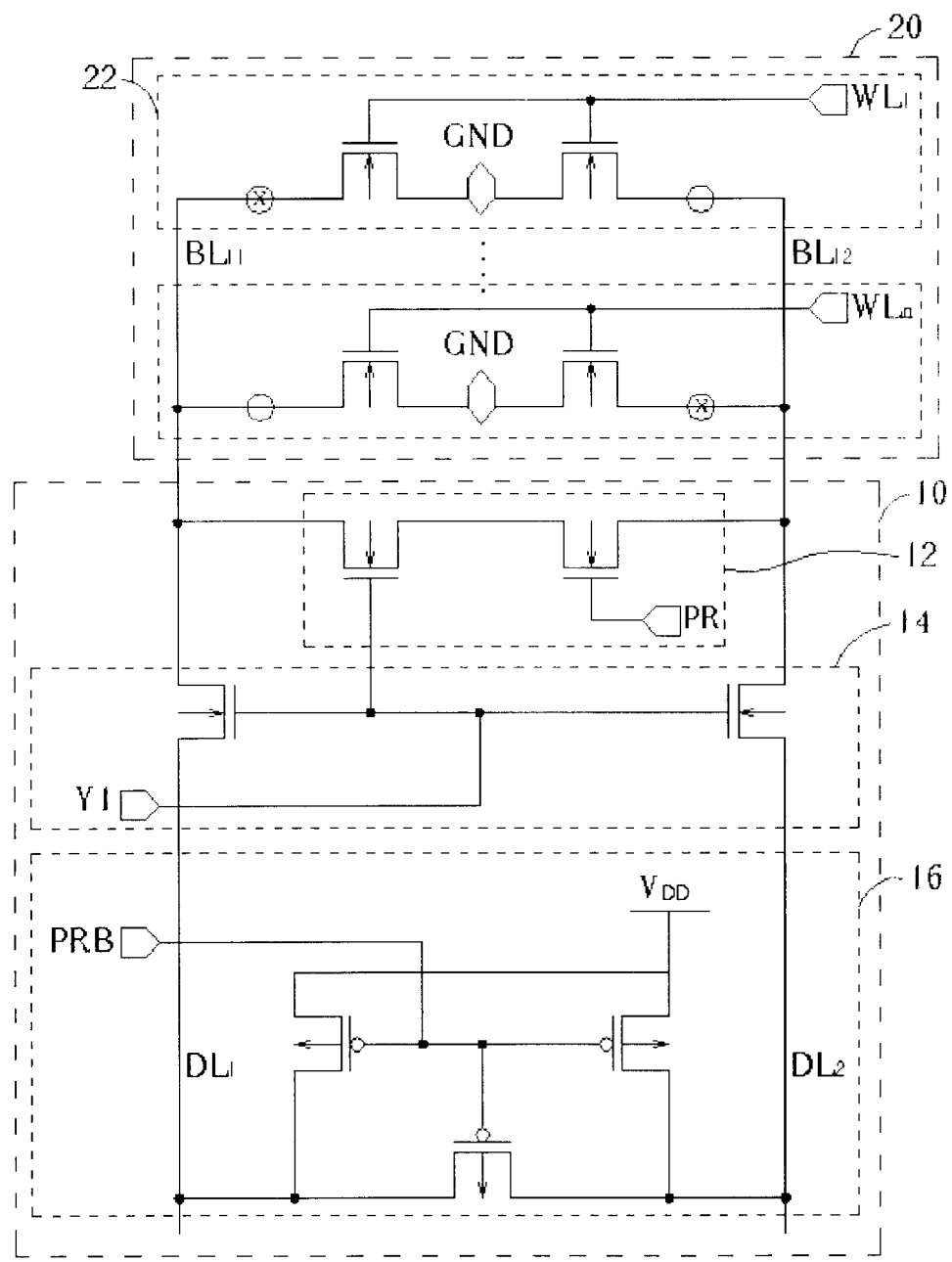
FIG. 1 is a schematic diagram of a sense-out circuit according to prior art.
Figure 2:
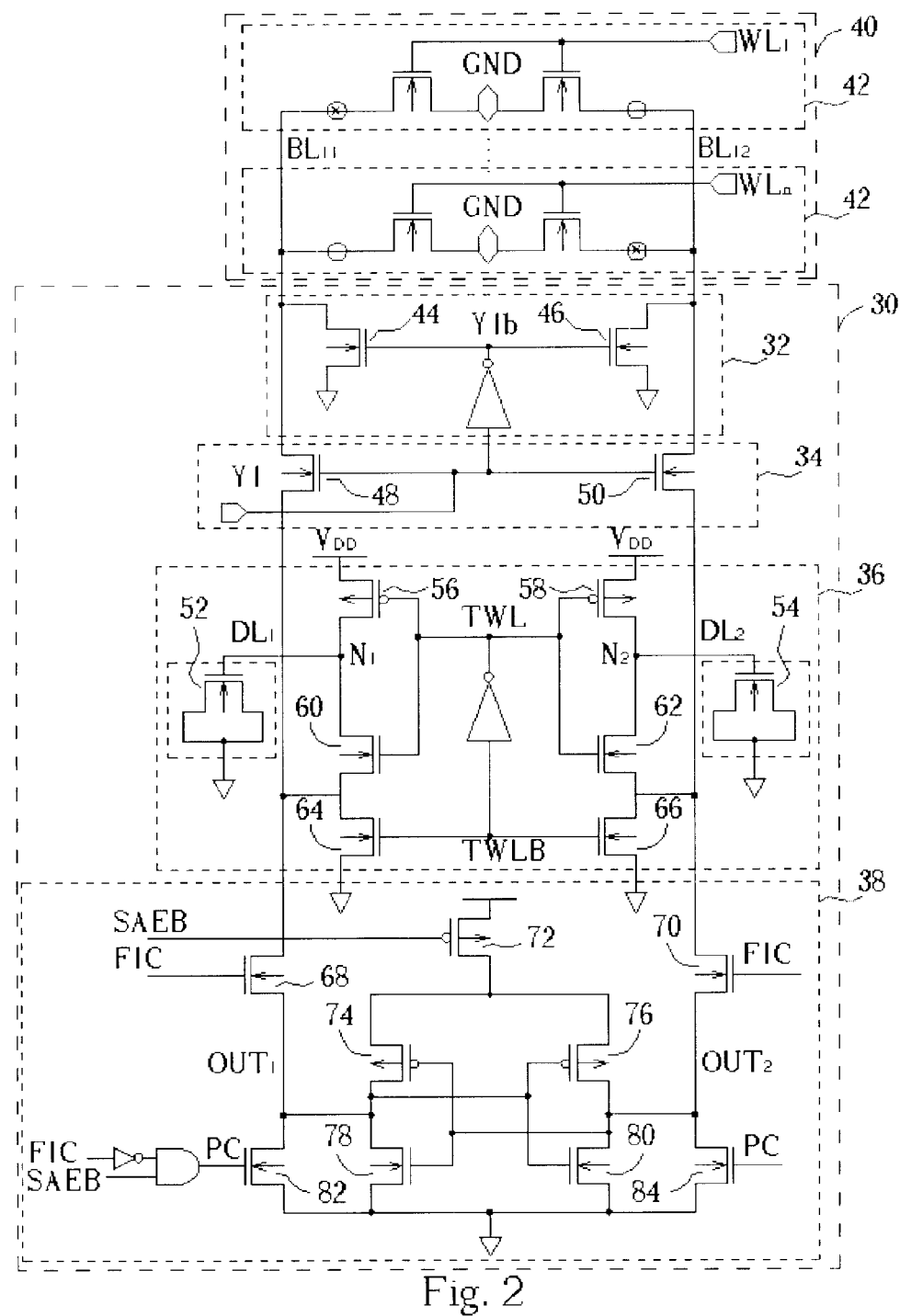
FIG. 2 is a schematic diagram of a pre-charge and sense-out circuit according to present invention.

Please refer to FIG. 2, showing a schematic diagram of a pre-charge and sense-out circuit of differential type ROM according to present invention. In FIG. 2, the differential type ROM is comprised of a pre-charge and sense-out circuit 30 and a memory cell array 40, in which the memory-cell array 40 is comprised a plurality of memory cells 42, wherein the memory-cell array 40 is exactly the same as the memory-cell array 20 shown in FIG. 1. The address of memory cell 42 is defined by a plurality of word lines WL1~WLn and a plurality of a pair of bit lines ($BL_{11}$, $BL_{12}$)~($BL_{m1}$, $BL_{m2}$), namely a memory cell 42 is electrically connected to the intersections of each word line and pair of bit lines.

In FIG. 2, the memory cell 42 is composed of two NMOS transistors. The sources of the two NMOS transistors are both grounded before writing data into the memory cell 42. The gates of the transistors are electrically connected to the same word line, but the drain of each transistor is electrically connected to a different bit line (such as, in FIG. 1 where the left NMOS transistor is electrically connected to the left bit line, and the right NMOS transistor is electrically connected to the right bit line). When writing logical data into the memory cell 42, one of the two inter-connections between an NMOS transistor and bit line needs to be cut (such as burning with laser) to assign a logical value into the memory cell 42. In the below description, cutting the left connection assigns a logical value of "1" to the memory cell 42 while cutting the right connection assigns a logical value of "0" to the memory cell 42.

The following example uses the pair of bit lines ($BL_{11}$, $BL_{12}$) from a plurality of pairs of bit lines ($BL_{11}$, $BL_{12}$)~($BL_{m1}$, $BL_{m2}$) to explain. The pair of bit lines ($BL_{11}$, $BL_{12}$) is electrically connected to the pre-charge and sense-out circuit 30. The pre-charge and sense-out circuit 30 is comprised of a first pre-charge module 32, electrically connected to the pair of bit lines ($BL_{11}$, $BL_{12}$) and used to pre-charge the bit lines; a selecting module 34, electrically connected to the pair of bit lines ($BL_{11}$, $BL_{12}$) and two data lines ($DL_1$, $DL_2$) and is used to transmit signals from each bit line to its corresponding data line e.g. bit line $BL_{11}$ to the data line $DL_1$ and bit line $BL_{12}$ to data line $DL_2$, as instructed by the first control signal Y1; a charge-sharing module 36, electrically connected to the two data lines ($DL_1$, $DL_2$) used to pre-charge the two data lines and share the electrical charges stored within itself with the two data lines ($DL_1$, $DL_2$) as instructed by the second control signal TWL; and a sensing module 38, electrically connected to the two data lines ($DL_1$, $DL_2$) to sense signals along the two lines to generate an output signal.

Please remember that although the above-mentioned example is explained using only one pair of bit lines ($BL_{11}$, $BL_{12}$) connected to two data lines ($DL_1$, $DL_2$), a plurality of pairs of bit lines connected to one set of data lines such as ($DL_1$, $DL_2$) each through a different selecting module 34 can exist and usually does in actual application.

As FIG. 2 shows the pre-charge and sense-out circuit is composed of many modules with each module itself being composed of many parts. At the top of the circuit in this embodiment is the pre-charge module 32, comprised of two charging NMOS transistors 44,46. The two charging NMOS transistors 44,46 are the same in that they both have a gate electrically connected to a complementary signal Y1b of the first control signal Y1, a source that is grounded, and are designed to turn on at the direction of the complementary signal Y1b of the first control signal Y1 to pre-charge the bit line to which they are attached but differ in that their drains are connected to different bit lines the drain of NMOS transistor 44 to bit line $BL_{11}$ and the drain of NMOS transistor 46 to bit line $BL_{12}$.

The next part shown is the selecting module 34, which is comprised of two selecting NMOS transistors 48,50. These two NMOS transistors are the same in that they both a gate electrically connected to the first control signal Y1 but differ in that their drains are connected to different bit lines and their sources are connected to different data lines the drain and source of selecting NMOS transistor 48 is connected to bit line $BL_{11}$ and data line $DL_1$ respectively and the drain and source of selecting NMOS transistor 50 is connected to bit line $BL_{12}$ and data line $DL_2$ respectively.

Continuing on in FIG. 2, the embodiment shows the charge-sharing module 36, which itself is comprised of several parts. First, there are two capacitors 52,54 present in the module. The two capacitors 52,54 are both electrically connected to their respective nodes capacitor 52 to node $N_1$, capacitor 54 to node $N_2$, have one end grounded, and are used to store electrical charges that are to be shared with their respective data lines capacitor 52 to data line $DL_1$ and capacitor 54 to data line $DL_2$.

Secondly, there are two PMOS transistors 56, 58 present. Each PMOS transistor 56, 58 has a source that is electrically connected to its respective power supply voltage $V_{DD}$, a gate electrically connected to the second control signal TWL, and a drain that is electrically connected to its respective node the drain of PMOS transistor 56 to node $N_1$ and the drain of PMOS transistor 58 to node $N_2$.

Then there are two NMOS transistors 60, 62 in the module. Each NMOS transistors 60, 62 has a drain electrically connected to its respective nodes the drain of NMOS transistor 60 to node $N_1$ and the drain of NMOS transistor 62 to node $N_2$, a gate electrically connected to the second control signal TWL, and a source electrically connected to its respective data line the source of NMOS transistor 60 to data line $DL_1$ and the source of NMOS transistor 62 to data line $DL_2$. The capacitors 52,54; PMOS transistors 56,58; and NMOS transistors 60,62 interact with each other via the second control signal. When the second control signal TWL is at low voltage (logical value "0"), the two NMOS transistors 60, 62 will turn off, and the two PMOS transistors 56, 58 will turn on. The two turned-on PMOS transistors 56, 58 will then charge their respective capacitors PMOS transistor 56 to capacitor 52 and PMOS transistor 58 to capacitor 54 through the opened channel. When the second control signal TWL is switched to high voltage (logic "1"), the two PMOS transistors 56, 58 will turn off, and the two NMOS transistors 60, 62 will turn on, allowing the two NMOS transistors 60,62 to share the stored electrical charges with their respective data lines (NMOS 60 to $DL_1$ and NMOS 62 to $DL_2$) through the opened channels.

In addition to the parts mentioned above, the charge-sharing module 36 is further comprised of two more NMOS transistors 64, 66. These two transistors have gates electrically connected to the complementary signal TWLB of the second control signal TWL, sources that are grounded, and drains electrically connected to their respective data line the drain of NMOS transistor 64 to data line $DL_1$ and the drain of NMOS transistor 66 to data line $DL_2$. The transistors turn on in response to the complementary signal TWLB of the second control signal TWL. The purpose of the NMOS transistors 64,66 is to pre-charge their respective data lines NMOS transistor 64 to data line $DL_1$ and NMOS transistor 66 to data line $DL_2$.

Moving on to the last part, the embodiment shows the sensing module 38. One part comprising the complex sensing module 38 is a pair of isolating NMOS transistors 68, 70. The isolating NMOS transistors have drains electrically connected to their respective data lines the drain of NMOS transistor 68 to data line $DL_1$ and the drain of NMOS transistor 70 to data line $DL_2$ gates electrically connected to a third control signal FIC, and sources electrically connected to their respective output signal line—the source of NMOS transistor 68 to output signal line $OUT_1$ and the source of NMOS transistor 70 to output signal line $OUT_2$.

Also present is an enabling PMOS transistor 72 where the source of the transistor is electrically connected to a power supply voltage $V_{DD}$, the gate is electrically connected to a fourth control signal SAEB, and the drain is electrically connected to two inverters in order to enable/disable the sensing module 38 as controlled by the fourth control signal SAEB.

The final parts of the sensing module 38 are the two inverters mentioned connected to the PMOS transistor 72 and another pair of NMOS transistors 82,84. The two inverters and two NMOS transistors 82,84 will be elaborated on below.

The inverters in FIG. 2 are each comprised of a PMOS transistor and a NMOS transistor one inverter being of PMOS transistor 74 and NMOS transistor 78 while the other inverter being PMOS transistor 76 and NMOS transistor 80 where the gates of the PMOS transistor and NMOS transistor are connected to each other and serve as the input end of the inverter and the drains of the PMOS transistor and NMOS transistor are connected to each other and serve as the output end of the inverter. The source of the PMOS transistor is electrically connected to the drain of the enabling PMOS transistor 72 while the source of the NMOS transistor is grounded.

As shown in this embodiment, the input end of the inverter comprised of PMOS transistor 74 and NMOS transistor 78 is electrically connected to the output signal line $OUT_2$ while the output end is electrically connected to the output signal line $OUT_1$. The input end of the other inverter comprised of PMOS transistor 76 and NMOS transistor 80 is electrically connected to the output signal line $OUT_1$ and the output end is electrically connected to the output signal line $OUT_2$. The output signal is generated on the output signal line $OUT_1$, while the complementary signal of the output signal is generated on the second output signal line $OUT_2$.

As for the two other NMOS transistors 82, 84, each NMOS transistor 82,84 has a drain electrically connected to a respective output signal line NMOS transistor 82 to output signal line $OUT_1$ and NMOS transistor 84 to output signal line $OUT_2$, a gate electrically connected a fifth control signal PC, and a grounded source. The two NMOS transistors 82, 84 are used to pre-charge their respective output signal the source of NMOS transistor 82 to output signal line $OUT_1$ and the source of NMOS transistor 84 to output signal line $OUT_2$. To pre-charge their respective output signal lines, the two NMOS transistors 82, 84 will be turned on in response to the fifth control signal PC. In FIG. 2, the fifth control signal PC is the result of the logical function "AND" of the logical value of the fourth control signal SAEB and the complementary logical value of the third control signal FIC. In other words, if either the complementary logical value of the third control signal FIC or the logical value of the fourth control signal SAEB is "0", the fifth control signal will send a logical value "0" to turn off the NMOS transistors 82, 84 in the sensing module 38.

Under the this circuit organization, as data is being read, the two isolating NMOS transistors 68, 70 will be turned on at suitable time as determined by the third control signal FIC in order to transmit the signals on the data line $DL_1$ to the output signal line $OUT_1$ and the signals on the line $DL_2$ to the second output signal line $OUT_2$. The said output signals are produced by locking the signals with lockers constructed from the two inverters. In addition, if the fourth control signal SAEB turns off the channel for enabling PMOS transistor 72 leading to no voltage bias, the first and the second inverters will not act. Conversely, if the fourth control signal SAEB turns on the channel for enabling PMOS transistor 72, the first and the second inverters will act normally and lock the signals on the first and the second output signal lines $OUT_1$, $OUT_2$.

Figure 3:
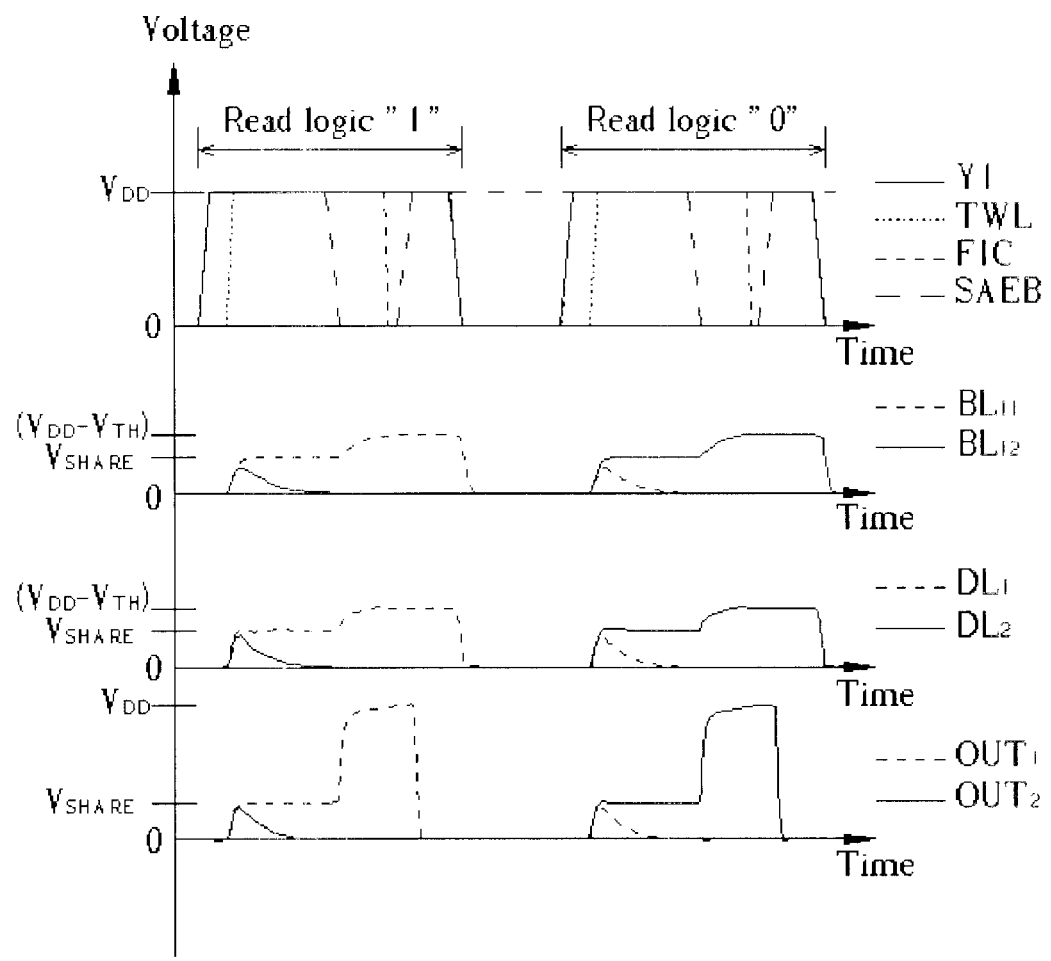
FIG. 3 is a time sequence diagram of the pre-charge and sense-out circuit shown in FIG. 2 while reading data.

FIG. 2 and FIG. 3 together give the detailed operation of the pre-charge and sense-out circuit 30 according to present invention. While FIG. 2 is a physical layout of the present invention, FIG. 3 is a time sequence diagram of the control signals and signal lines in FIG. 2 of the pre-charge and sense-out circuit 30 while it reads digital data stored in a memory cell 42 of the memory cell array 40 (such as a memory cell located at the intersection of the word line $WL_1$ and the pair of bit lines ($BL_{11}$, $BL_{12}$)).

In other words, the diagrams shows the process of the pre-charge and sense-out circuit 30 reading the logical values of "0" and "1" from the output signals on the first output signal line $OUT_1$ according to a time sequence.

For ease of explanation and comparison, the four active control signals Y1, TWL, FIC and SAEB are placed on same time axis while the three other pairs of positive signals ($BL_{11}$, $BL_{12}$), ($DL_1$, $DL_2$), ($OUT_1$, $OUT_2$) are placed on their respective time axes. That is to say, FIG. 3 graphs the first control signal Y1, the second control signal TWL, the third control signal FIC, and the fourth control signal SAEB on the top diagram, the signals on the two bit lines $BL_{11}$, $BL_{12}$ on the second diagram, the two data lines $DL_1$, $DL_2$ on the third diagram, and the output signal lines $OUT_1$, $OUT_2$ on the last diagram.

Not all the signals mentioned in paper need to be graphed. For example, the signals Y1$b$ and TWLB do not need to be sketched in any of the graphs because of their complementary nature to control signals Y1$b$ is complementary to control signal Y1 while TWLB is complementary to second control signal TWL. Also since the signal on the word line $WL_1$ is synchronous with the second control signal TWL, and the fifth control signal PC is the logical combination of the third and the fourth control signals FIC, SAEB, they too need not be sketched in FIG. 3.

The left half of FIG. 3 explains the operation of the pre-charge and sense-out circuit 30 while reading the digital data value of "1" stored in a memory cell 42 of the memory cell array 40 (namely a memory cell 42 that has its left interconnection cut). Before reading data, the first control signal Y1, the second control signal TWL, and the third control signal FIC are all have a logical value of "0", and the fourth control signal SAEB is set to the logical value of "1". This means the complementary signals Y1$b$ and TWLB have the logical value of "1", the signal on the word line is synchronous with the second control signal TWL by having a logical value of "0", and the fifth control signal has a logical value of "1".

Under such a situation, the two selecting NMOS transistors 48, 50 and the two isolating NMOS transistors 68, 70 in the selecting module 34 will be turned off; the NMOS transistors 44, 46 in the pre-charging module 32, the NMOS transistors 64, 66 in the charge-sharing module 36 and the NMOS transistors 82, 84 in the sensing module 38 will be turned on; and the pair of bit lines ($BL_{11}$, $BL_{12}$), the two data lines ($DL_1$, $DL_2$), and the two output signal lines ($OUT_1$, $OUT_2$) will be pre-charged to 0V. In addition, with the NMOS transistors 60, 62 are turned off at this moment and the PMOS transistors 56, 58 are turning on, the two capacitors 52, 54 will begin to collect and store charges, making the voltage on the two nodes N1, N2 both the same as $V_{DD}$. Also, the locker composed of the two inverters in the sensing module 38 will be disabled since the PMOS transistor 72 is turned off.

When reading is started, a number of things happen. First of all, the first control signal Y1 and the third control signal FIC are simultaneously switched to the logical value "1" (namely $V_{DD}$). At the same time, a number of transistors are being turned off and on. The two charging NMOS transistors 44, 46 are turned off to stop the charging of the two bit lines $BL_{11}$, $BL_{12}$ while the NMOS transistors 82, 84 are turned off to stop the charging of the two output signal lines $OUT_1$, $OUT_2$. The two selecting NMOS transistors 48, 50 and the two isolating NMOS transistors 68, 70 are turned on in order to facilitate the sharing of electrical charges among the pair of bit lines $BL_{11}$, $BL_{12}$, the two data lines $DL_1$, $DL_2$, and the two output signal lines $OUT_1$, $OUT_2$.

Secondly, the second control signal TWL and the word line $WL_1$ synchronized with the second control signal TWL are switched to a logical value of "1" each having their own effect. Switching the word line $WL_1$ turns the two NMOS transistors of the memory cell 42 on resulting in the grounding of the bit line still connected to the memory cell 42 (the second bit line $BL_{12}$ in this embodiment) through the channel of the NMOS transistor. Switching the second control signal TWL to logical of "1" turns the NMOS transistors 64, 66 off, stopping the charging of the two data lines $DL_1$, $DL_2$. It also causes the PMOS transistors 56, 58 to turn off and stop the charging of the two capacitors 52, 54, and the NMOS transistors 60, 62 to turn on, allowing the two capacitors 52, 54 to share stored-electrical charges with the pair of bit lines $BL_{11}$, $BL_{12}$, the two data lines $DL_1$, $DL_2$, and the two output signal lines $OUT_1$, $OUT_2$ through the channels of the NMOS transistors 60, 62.

Before the charges are shared, the above-mentioned capacitors are charged to $V_{DD}$, and signal lines bit lines, data lines and output signal lines are charged to 0V. After the charges are shared, the voltages of a group of connected signal lines defined as the connection of a bit line, data line, and output signal line on one path will rise to a voltage value of $V_{SHARE}$. The voltage value of $V_{SHARE}$ is determined by the equation: $V_{SHARE}=V_{DD} \times C_C \div (C_C+C_{(BL+DL+OUT)})$ where $C_C$ is equal to the capacitance of the capacitor in the group of connected signal lines and $C_{(BL+DL+OUT)}$ is equal to the summed capacitance of each one of the connected signal lines in the group. Assuming the capacitances of the two capacitors 52, 54 are of equal value, the two groups of lines should have an equal $C_{(BL+DL+OUT)}$. In other words the summed capacitance of bit line $BL_{11}$, data line $DL_1$, and output signal line $OUT_1$ $C_{(BL11+DL1+OUT1)}$ should be equal to the summed capacitance of bit line $BL_{12}$, the data line $DL_2$, and output signal line $OUT_2$ $C_{(BL12+DL2+OUT2)}$. This means that both groups of signal lines will rise to and have the same $V_{SHARE}$ voltage value. However, the group of lines bit line $BL_{12}$, data line $DL_2$, and output signal line $OUT_2$ will fall back to 0V in a short period after reaching the $V_{SHARE}$ value because these lines are grounded through the channel of the NMOS transistor in memory cell 42, all of which can be seen in FIG. 3.

Then, the fourth control signal SAEB will be switched to logical value of "0" (namely 0V), therefore, turning the PMOS transistor 72 on and enabling the locker composed of the two inverters in the sensing module 38. The signals on the two output signal lines $OUT_1$, $OUT_2$ will then be separately locked at $V_{DD}$ and 0V. The effect of the locker will allow the output signal corresponding to the digital data stored in the memory cell 42 to be read as a logical value of "1" on output signal line $OUT_1$. In addition, the voltages of bit line $BL_{11}$ and data line $DL_1$ will be limited to ($V_{DD}-V_{TH}$) because of the effects of selecting NMOS transistor 48 and isolating NMOS transistor 68 (wherein $V_{TH}$ is the threshold voltage of the NMOS transistor). This in turn can reduce the power consumption while operating the pre-charge and sense-out circuit 30.

Finally, in the order mentioned, the third control signal FIC is switched back to the logical value "0", the fourth control signal SAEB is switched back to logical value "1", and the first control signal Y1 and the second control signal TWL (and the word line WL$_1$) is switched back to the logical value "0" in order to prepare for next step in the reading operation.

The right half of FIG. 3 explains the operation of the pre-charge and sense-out circuit 30 while reading the digital data "0" stored in a different memory cell 42 of the memory cell array 40 (namely a memory cell 42 that has its right interconnection cut). The actions of the first, the second, the third and the fourth control signals Y1, TWL, FIC and SAEB are all the same as the actions involved while reading the digital data value "1". However, since the right interconnection of the memory cell 42 is cut, the voltages in each pair of signal lines e.g. the bit lines BL$_{11}$, BL$_{12}$ are opposite, data lines DL$_1$, DL$_2$, and output signals OUT$_1$, OUT$_2$ are opposite to what they are when reading a logical value "1" as FIG. 3 shows. Finally, the output signal corresponding to the digital data stored in the memory cell 42 is read out as a logical value "0" on the first output signal line OUT$_1$.

In contrast to the prior art, the present pre-charge and sense-out circuit uses a pre-charging module and a charge-sharing module to pre-charge the pair of bit lines, the two data lines to ground voltage in order to prevent current leakage from the unselected bit line in the pair from affecting the reading of data from the selected bit line in the memory cell. The charge-sharing module shares electrical charges with the two data lines when date is being read, and also speeds up the signals on the two data lines into a stable state. In addition, the voltage of the bit line and the data line will be limited to ($V_{DD}$–$V_{TH}$) because of the effects of a selecting NMOS transistor and a isolating NMOS transistor, all the while reducing power consumption during the operation of the pre-charge and sense-out circuit.

Those skilled in the art will readily observe that numerous modifications and alterations in the device may be made while retaining the teachings of the invention. Accordingly, the above disclosure should be construed as limited only by the metes and bounds of the appended claims.

What is claimed is:

1. A pre-charge and sense out circuit of a differential type ROM for sensing logic data stored in a memory cell of the ROM, the memory cell being capable of connecting to one of a first bit line and a second bit line for providing digital signals to the first bit line or the second bit line, the pre-charge and sense out circuit comprising:

a pre-charge module electrically connected to the first and the second bit lines for pre-charging the first and the second bit lines;

a selecting module electrically connected to the first bit line, the second bit line, a first data line, and a second data line, for transmitting signals on the first bit line to the first data line and signals on the second bit line to the second data line according to a first control signal;

a charge sharing module electrically connected to the first and the second data lines for pre-charging the first and the second data lines, and for sharing electrical charges stored in the charge sharing module with the first and the second data lines according to a second control signal; and a sensing module electrically connected to the first and the second data lines for sensing signals on the first and the second data lines to generate an output signal.

2. The pre-charge and sense out circuit of claim 1 wherein the charge sharing module comprises:

a first capacitor whereof one end is electrically connected to a first node and another end is grounded, for storing electrical charges to be shared with the first data line;

a first PMOS transistor whereof a source is electrically connected to a power supply voltage, a gate is electrically connected to the second control signal, and a drain is electrically connected to the first node;

a first NMOS transistor whereof a drain is electrically connected to the first node, a gate is electrically connected to the second control signal, and a source is electrically connected to the first data line;

a second capacitor whereof one end is electrically connected to a second node and another end is grounded, for storing electrical charges to be shared with the second data line;

a second PMOS transistor whereof a source is electrically connected to the power supply voltage, a gate is electrically connected to the second control signal, and a drain is electrically connected to the second node; and a second NMOS transistor whereof a drain is electrically connected to the second node, a gate is electrically connected to the second control signal, and a source is electrically connected to the second data line.

3. The pre-charge and sense out circuit of claim 2 wherein the charge sharing module further comprises:

a third NMOS transistor whereof a drain is electrically connected to the first data line, a gate is electrically connected to a complementary signal of the second control signal, and a source is grounded, for pre-charging the first data line; and a fourth NMOS transistor whereof a drain is electrically connected to the second data line, a gate is electrically connected to the complementary signal of the second control signal, and a source is grounded, for pre-charging the second data line.

4. The pre-charge and sense out circuit of claim 1 wherein the pre-charge module comprises:

a first charging NMOS transistor whereof a drain is electrically connected to the first bit line, a gate is electrically connected to a complementary signal of the first control signal, and a source is grounded; and a second charging NMOS transistor whereof a drain is electrically connected to the second bit line, a gate is electrically connected to the complementary signal of the first control signal, and a source is grounded.

5. The pre-charge and sense out circuit of claim 1 wherein the selecting module comprises:

a first selecting NMOS transistor whereof a drain is electrically connected to the first bit line, a gate is electrically connected to the first control signal, and a source is electrically connected to the first data line; and a second selecting NMOS transistor whereof a drain is electrically connected to the second bit line, a gate is electrically connected to the first control signal, and a source is electrically connected to the second data line.

6. The pre-charge and sense out circuit of claim 1 wherein the sensing module comprises:

a first isolating NMOS transistor whereof a drain is electrically connected to the first data line, a gate is electrically connected to a third control signal, and a source is electrically connected to a first output signal line;

a second isolating NMOS transistor whereof a drain is electrically connected to the second data line, a gate is electrically connected to the third control signal, and a source is electrically connected to a second output signal line;

a first inverter whereof an input end is electrically connected to the second output signal line and an output end is electrically connected to the first output signal line; and a second inverter whereof an input end is electrically connected to the first output signal line and an output end is electrically connected to the second output signal line;

wherein the output signal is generated on the first output signal line, and a complementary signal of the output signal is generated on the second output signal line.

7. The pre-charge and sense out circuit of claim 6 wherein the sensing module further comprises an enabling PMOS transistor whereof a source is electrically connected to a power supply voltage, a gate is electrically connected to a fourth control signal, and a drain is electrically connected to the first and the second inverter, for enabling/disabling the sensing module according to the fourth control signal.

8. The pre-charge and sense out circuit of claim 7 wherein the first inverter comprises a PMOS transistor and an NMOS transistor, gates of the PMOS transistor and the NMOS transistor being connected to each other as the input end of the first inverter, drains of the PMOS transistor and the NMOS transistor being connected to each other as the output end of the first inverter, a source of the PMOS transistor being electrically connected to a drain of the enabling PMOS transistor, a source of the NMOS transistor being grounded.

9. The pre-charge and sense out circuit of claim 7 wherein the second inverter comprises a PMOS transistor and an NMOS transistor, gates of the PMOS transistor and the NMOS transistor being connected to each other as the input end of the second inverter, drains of the PMOS transistor and the NMOS transistor being connected to each other as the output end of the second inverter, a source of the PMOS transistor being electrically connected to a drain of the enabling PMOS transistor, a source of the NMOS transistor being grounded.

10. The pre-charge and sense out circuit of claim 6 wherein the sensing module further comprises:

a third NMOS transistor whereof a drain is electrically connected to the first output signal line, a gate is electrically connected to a fifth control signal, and a source is grounded, for pre-charging the first output signal line; and a fourth NMOS transistor whereof a drain is electrically connected to the second output signal line, a gate is electrically connected to the fifth control signal, and a source is grounded, for pre-charging the second output signal line.

* * * * *